United States Patent [19]

Mower

[11] Patent Number: 4,801,900
[45] Date of Patent: Jan. 31, 1989

[54] IMAGE REJECT APPARATUS FOR SIGNAL SYNTHESIS APPLICATIONS

[75] Inventor: Vaughn L. Mower, Bountiful, Utah
[73] Assignee: Unisys Corporation, Blue Bell, Pa.
[21] Appl. No.: 135,167
[22] Filed: Dec. 18, 1987
[51] Int. Cl.[4] ............................................. H03C 1/60
[52] U.S. Cl. .................................................... 332/45
[58] Field of Search .......................... 332/45; 307/512; 328/166, 167, 14

[56] References Cited

U.S. PATENT DOCUMENTS 3,243,731  3/1966  Erickson ........................... 332/45 X

OTHER PUBLICATIONS

Williams et al., Eleventh Annual Asilomar Conference on Circuits Systems and Computers, Nov. 7-9, 1977, pp. 184-193.

Microwaves, Single Sideband Modulators Cover Broad Bandwidths, Jul. 1982, vol. 21, No. 7, pp. 89 & 96.

*Primary Examiner*—Eugene R. LaRoche
*Assistant Examiner*—Robert J. Pascal
*Attorney, Agent, or Firm*—John B. Sowell; Kevin K. Peterson; Thomas J. Scott

[57] ABSTRACT

An image reject apparatus for covering a broad range of signal systhesis frequencies is provided with a digital phase shifter having an input for receiving modulated signals at twice the desired output frequency. A modulator comprising a power divider having a radio frequency (RF) input, a pair of mixers coupled to the outputs of said digital phase shifter and to the outputs from said power divider provides mixer output signals which are combined to produce sum and difference product signals as desired side band signals.

10 Claims, 4 Drawing Sheets

IMAGE REJECT APPARATUS FOR SIGNAL SYNTHESIS APPLICATIONS

BACKGROUND OF THE INVENTION

1. Field of the Invention

The present invention relates to image reject circuits. More particularly, the present invention relates to image reject apparatus suited for frequency synthesis applications where the bandwidth ratios exceed 200 to 1 and the input data stream is a low frequency digital signal being mixed with a much higher radio frequency signal.

2. Description of the Prior Art

Image rejection circuits are known in the prior art, however, such circuits have a relatively narrow modulation frequency bandwidth which does not exceed a bandwidth ratio of 200 to 1 and are not suitable for synthesis applications. Further, the phase tracking degradation versus modulation frequency is generally unacceptable for frequency synthesis applications requiring linear phase-versus-modulation-frequency.

The simplest form of prior art reject apparatus employs a single mixer having a modulation signal input and an RF signal input to produce a pair of side band signals that occur on either side of the RF center frequency. By filtering the output, one of the side bands can be removed leaving the desired output signal which is usually coupled to a phase-locked loop as the input signal to the phase-locked loop.

Another form of image reject circuit employs two mixers at the input. The RF signal is applied as an input to both mixers. One of these mixers is provided with an RF input and the other mixer is supplied with a 90° phase shifted RF input. The output of the two mixers is recombined in a power combiner employing phase cancellation techniques. The network employed to phase shift the modulation signal restricts the bandwidth and if a different bandwidth output is desired the reject circuit must be redesigned for specific bandwidth ratios and is incapable of covering a ratio in excess of 200 to 1.

A more sophisticated prior art approach to image rejection employs a quadrature hybrid circuit in the modulation signal path and a second quadrature hybrid circuit in the output path of the two mixers to produce a true sum and difference pair of signals or side bands. This image rejection circuit employs phase cancellation techniques as mentioned above. The phase shifter of the modulation signal is limited in bandwidth which limits the bandwidth ratio to a value less than 200 to 1 similar to the circuit described above. When an image reject circuit is desired for frequency synthesis applications requiring a large modulation frequency range in excess of 200 to 1, the prior art circuits described above are not operable with frequency synthesis applications because they constrain the modulation bandwidth. Furthermore, the output signal phase and amplitude from the prior art object circuits is degraded due to frequency dependent phase and amplitude variations of the 90° phase shifters used in prior art circuits.

It would be extremely desirable to provide an image reject apparatus and circuit for frequency synthesis applications having a modulation bandwidth in excess of 200 to 1 and which will provide minimal degradation of the phase of the modulating signal.

SUMMARY OF THE INVENTION

It is a principal object of the present invention to provide an improved image reject circuit which is capable of being used in fixed frequency square wave frequency synthesis applications.

It is another principal object of the present invention to provide a frequency synthesized image reject circuit which is particularly suited as an input to a phase-locked loop which locks onto the selected image signal and which filters out undesirable modulation frequency harmonics.

It is another principal object of the present invention to provide a novel digital phase shifter which is coupled to a novel modulator whose input frequency is twice the desired modulated side band frequency.

It is a general object of the present invention to provide a novel image reject circuit which mixes a low frequency digital input square wave signal with a much higher radio frequency signal.

It is a general object of the present invention to provide a novel image reject circuit which eliminates analog phase-shifters in the modulating signal circuit.

It is a general object of the present invention to provide a novel image reject circuit having a novel digital phase shifting circuit which is operable over a very broad range of frequencies and limited only by the speed of the devices employed in the digital circuits.

It is a general object of the present invention to provide a novel image reject circuit which has a negligible phase degradation versus modulation frequency.

It is an object of the present invention to provide a novel image reject circuit having bandwidth ratios in excess of 200 to 1 and is particularly suited for eliminating linear phase distortions versus frequency.

According to these and other objects of the present invention there is provided a digital phase shifter having an input for receiving modulated signals (2FM) at twice the desired the output sideband frequency. A modulator comprising a power divider having an RF frequency ($F_{RF}$), a pair of mixer coupled to the output of said digital phase shifter and to the outputs from said power divider to provide mixer output signals which are combined to produce sum and difference signals at the desired side band frequencies ($F_{RF}+F_M$) and/or ($F_{RF}-F_M$).

Figure 7:
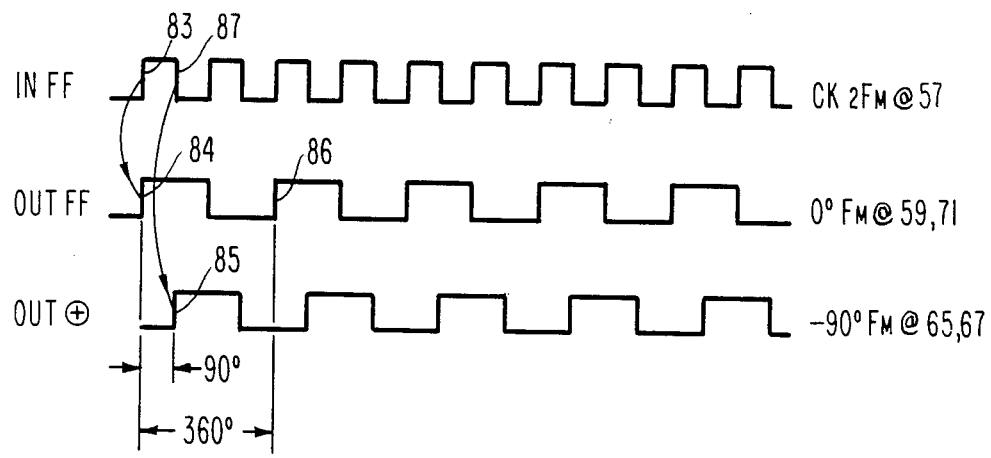
Figure 6:
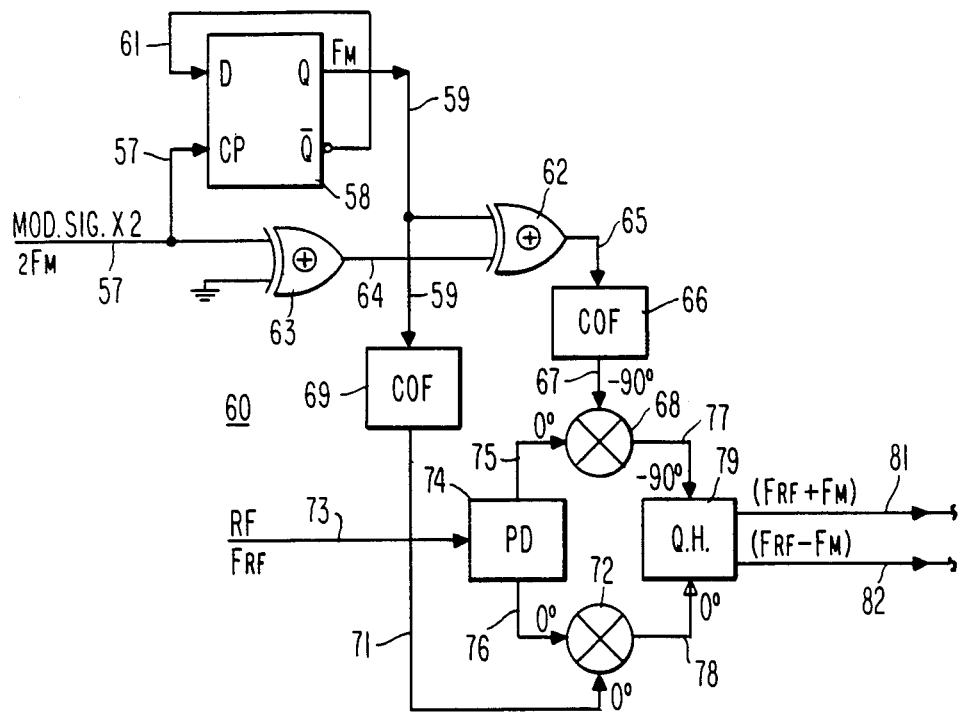
FIG. 6 is a block diagram of the preferred embodiment of the present invention employing a pair of mixers and a single quadrature hybrid circuit in the output path having a bandwidth ratio in excess of 200 to 1 which makes the circuit useful in frequency synthesis application.
Figure 8:
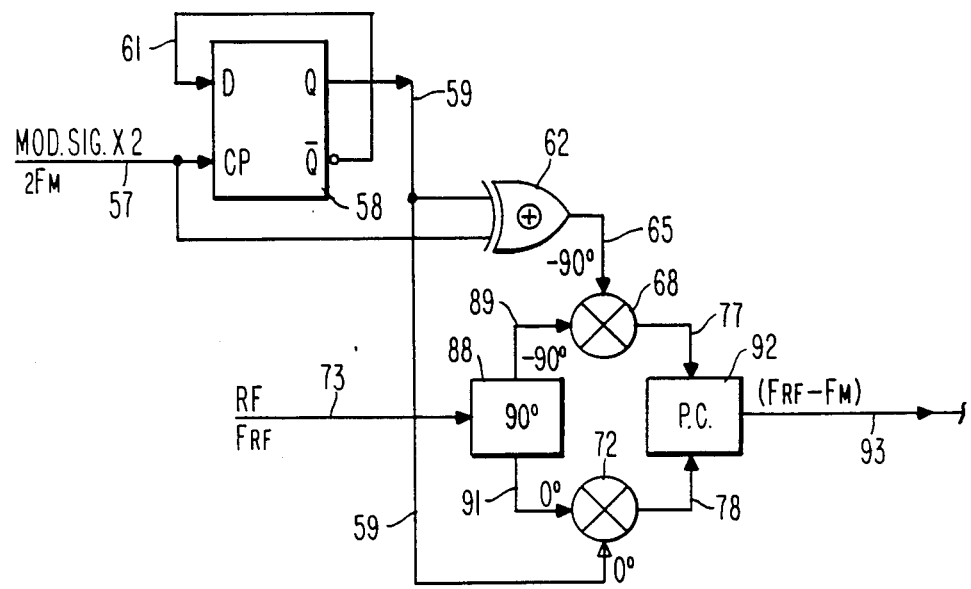
Figure 9:
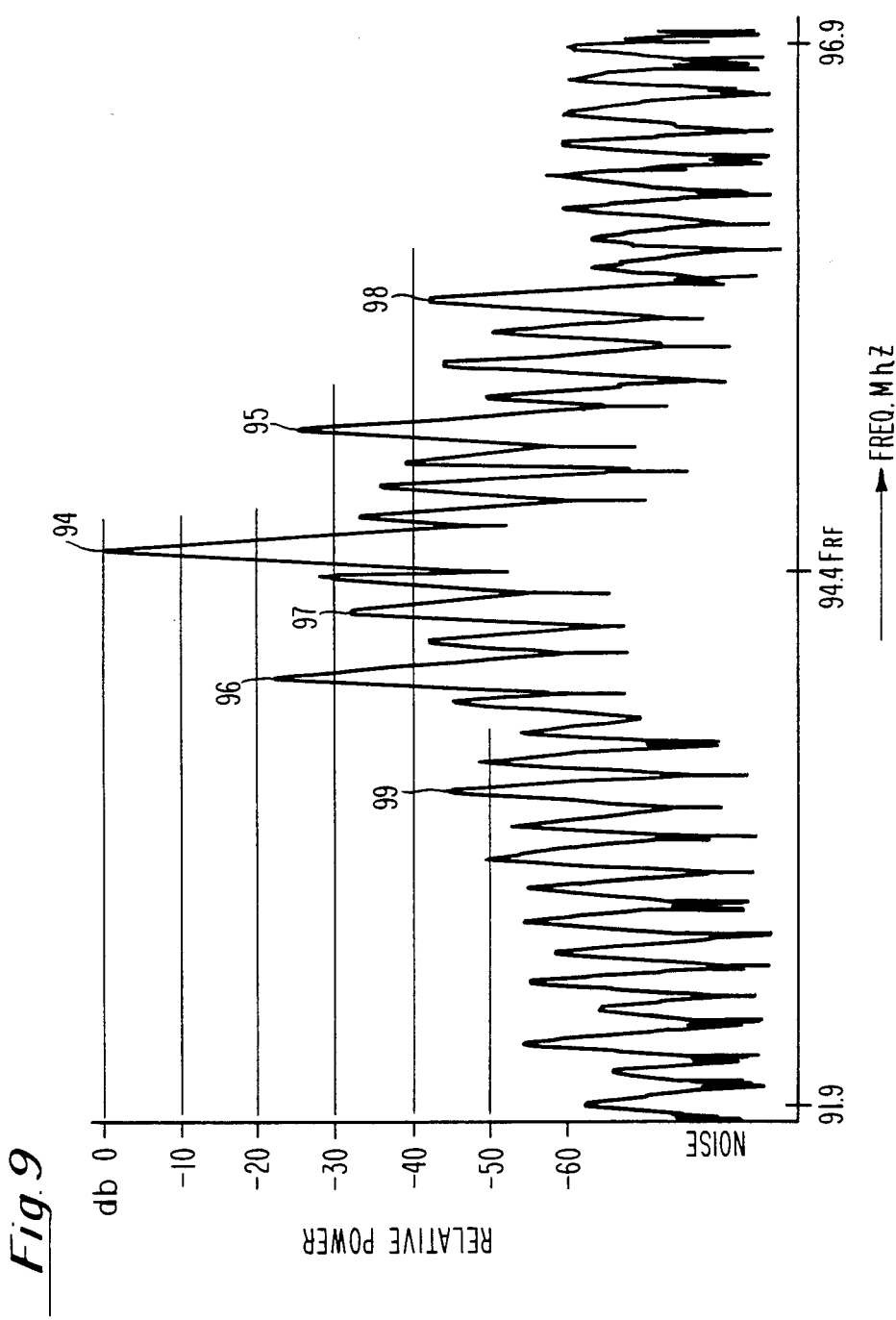

FIG. 7 is a waveform diagram showing the principle of operation of the digital phase shifter which is employed in the novel image reject circuit of FIG. 6;

FIG. 8 is a block diagram of a different form of modulator employing the novel digital phase shifter to produce one of two single side band outputs; and FIG. 9 is a diagram of the frequency spectrum waveform showing the output of the novel image reject circuit.

DESCRIPTION OF THE PREFERRED EMBODIMENT

Before describing the prior art image reject circuits and the present invention image reject circuits, it is well to note that the prior art image reject circuits are intended to provide 15 to 20 decibels (db) rejection of the undesired image. The present invention image reject circuit is designed to be operable over a wide range of digital modulating frequencies, and are also designed for producing sum and difference signals for use with phase-locked loops that perform as a filter for the sum and difference frequency signals and may be provided with as little as 8 to 10 decibels rejection of the undesired signal. However, when the present invention image reject circuit is to be employed with circuits other than self-filtering phase-locked loops, optional cutoff filters (preferably programmable filters) are inserted in the digital inputs to the mixers, thus increasing the rejection ratios.

Figure 1:
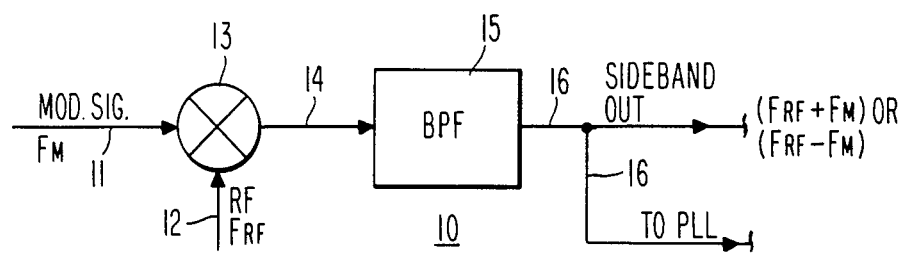
FIG. 1 is a block diagram of a simplified prior art image reject circuit.

Refer now to FIG. 1 showing a block diagram of a simplified prior art image reject circuit 10. The modulation signal is applied to input line 11 and the radio frequency input is applied to line 12 of mixer 13 to produce a mixer output on line 14 which is applied to the band pass filter 15. The band pass filter removes one of the undesired side bands leaving the desired side band signal frequency on output line 16 which is typically applied to a phase-locked loop or other utilization device.

Figure 2:
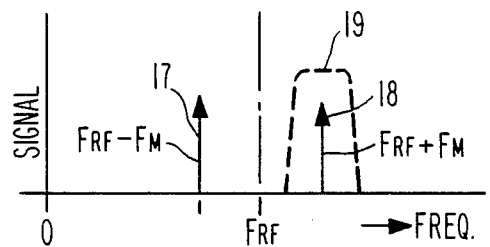
FIG. 2 is a frequency waveform diagram showing the band pass filtering of the signal in FIG. 2.

Refer now to FIG. 2 showing the effect of the band pass filtering of a side band. The lower image spectral line 17 showing the difference frequency is located symmetrically to the center RF frequency. The spectral line of the sum frequency 18 is shown having a phantom line 19 covering the spectral line indicative of the frequency covered by the band pass filter 15. If the spectral lines 17 and 18 occur too close to the center frequency, the band pass filter 15 will be unable to filter out the undesired side band.

Figure 3:
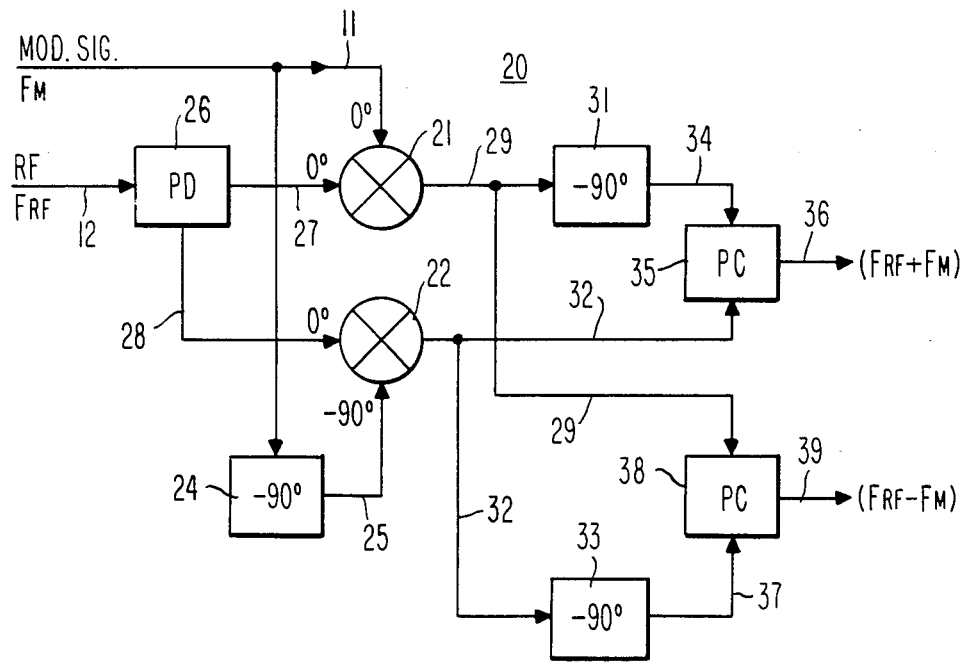
FIG. 3 is a block diagram of a prior art image reject circuit which employs a pair of mixers and a pair of power combiners using phase cancellation techniques in the output path.

Refer now to FIG. 3 showing a block diagram of another prior image reject circuit 20 of the type which employs a pair of mixers 21 and 22 in the input path. The modulation signal on input line 11 is again applied to a mixer 21 and also to an analog 90° phase shifter 24 to produce a phase shifted signal on input line 25 to mixer 22. A RF signal on line 12 is now applied to a power divider 26 and the output of the power divider is applied on lines 27 and 28 to mixers 21 and 22 respectively. Line 29 contains the output sum and difference products from mixer 21 and is applied to a second analog 90° phase shifter 31. Similarly, the sum and difference products on line 32 from mixer 22 are applied to analog 90° phase shifter 33. The sum and difference product on line 29 is phase shifted in shifter 31 to produce a phase shifted sum and difference product on line 34 which is applied to the power combiner 35 along with the sum and difference product on line 32 to produce the upper side band desired frequency on line 36. Similarly the sum and difference product on line 32 is phase shifted in shifter 33 to produce a sum and difference product on line 37 which is applied to the power combiner 38 along with the sum and difference product on line 29 to produce the lower side band desired frequency on line 39. Before referring to FIG. 4 it will be noted that the signal on line 11 is the modulation signal which varies over a wide range of frequencies and is applied to an analog 90° phase shifter 24 which limits the available bandwidth of operation of the output signal on line 25, thus, limiting the bandwidth of operation of the whole image reject circuit 20. Even though analog phase shifters 31 and 33 are employed in the output circuit they are designed to be operated at narrow band widths about the RF frequency ($F_{RF}$) and do not limit the image reject performance of the circuit 20.

Figure 4:
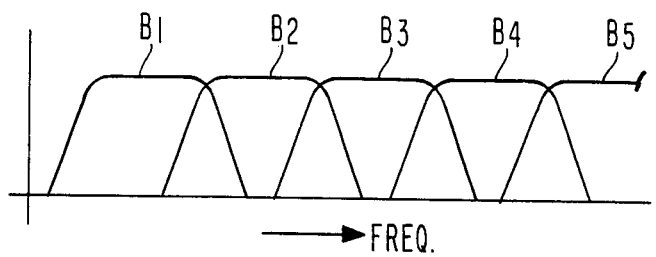
FIG. 4 is a frequency waveform diagram showing overlapping limited band widths applicable to the image reject circuit of FIG. 3.

FIG. 4 is a frequency waveform diagram showing the overlapping limiting band widths applicable to the image reject circuit of FIG. 3. The band labelled B1 covers a frequency spectrum of no more than 200 to 1 ratio of the upper band edge to the lower band edge. Similarly the overlapping band widths of bands of B2, B3, B4 and B5 illustrate bands that would require a change of the values of the resistors, capacitors and inductive reactances in the circuit comprising analog 90° phase shifter 24. It will be appreciated that the bandwidth waveform diagrams of FIG. 4 are designed to show band widths and do not illustrate the problems of distortion and phase delay at the output which are common with prior art analog phase shifters.

Figure 5:
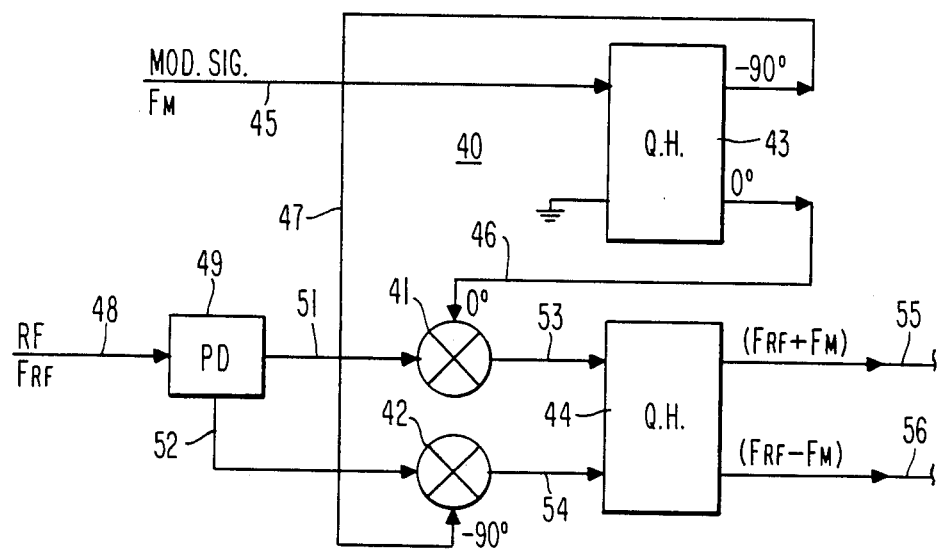
FIG. 5 is a block diagram of another prior art image reject circuit employing a pair of mixers and a pair of quadrature hybrid circuits which also employ phase cancellation techniques.

Refer now to FIG. 5 showing a block diagram of a prior art image reject circuit 40 employing a pair of mixers 41 and 42 and a pair of quadrature hybrid circuits and 43 and 44. The modulation signal on line 45 is applied to the first quadrature hybrid circuit 43 to produce a real or zero phase output signal on line 46 and an imaginary or 90° phase shifted signal on line 47. The radio frequency signal on line 48 is applied to a power divider 49 to provide inphase power output signals on lines 51 and 52 which are applied to the mixers 41 and 42 respectively along with the modulation signal on line 46 and phase sifted modulations signal on line 47. The sum and difference product on line 53 from mixer 41 is applied to one input of the quadrature hybrid circuit 44 and the sum and difference product on line 54 from mixer 42 is applied to the other input of quadrature hybrid circuit 44 to produce separate and distinct sum and difference product signals on lines 55 and 56 respectively. The quadrature hybrid circuit 43 in FIG. 5 performs the same analog phase shifting function as the 90° phase shifter 24 in FIG. 3 and the two image reject circuits 20 and 40 are bandwidth limited for the same technical reasons described hereinbefore with regards to FIG. 3. Further, it will be noted that the quadrature hybrid circuit 44 essentially performs the identical function as the logic blocks 29 through 39 described in more detail hereinbefore with regards to FIG. 3. Quadrature hybrid circuits are commercially available from such vendors as Merrimac Industries, Inc. in West Caldwell, N.J. and Adams-Russell Electronics Co., Inc. in Burlington, Mass. The prior art FIG. 1 image reject circuit is widely used in those applications where the percentage bandwidth or the band pass filter 15 following the mixer is narrow enough to filter the undesired image output signal and wide enough to pass the modulating frequency bandwidth signal. This prior art type circuit is not practical for frequency synthesis applications which require bandwidth ratios in excess of 200 to 1.

The image reject circuits shown and described in FIGS. 3 and 5 are widely used in single side band (SSB) modulators which accept modulating wave forms such as audio signals. Single side band modulators have adequate phase and amplitude balance to produce side band rejections on the order of about 20 decibels. Practical implementations of the image reject circuits of FIGS. 3 and 5 are limited to bandwidth ratios less than 200 to 1 and thus are not usable for many frequency synthesis applications. The image reject circuits of FIGS. 3 and 5 suffer from the same inadequacies as the circuit of FIG. 1 in that the phase degradation versus modulation frequency is completely unacceptable for high frequency synthesis applications requiring linear phase versus modulation frequency.

Refer now to FIG. 6 showing a block diagram of the preferred embodiment image reject circuit 60 employing a pair of mixers and a single quadrature hybrid circuit. The modulation signal on input line 37 is shown at twice the frequency ($2F_M$) of the modulation frequency ($F_M$) which will appear in the output side band frequency of the sum and difference products. This pre-condition of having a multiple of the desired frequency at the modulation signal input is a necessary component of the proper operation of the present invention. Further, it will be noted that the frequency of the modulation signal on line 57 may be from zero frequency to frequencies well over 100 megahertz. When the modulation signal is a DC signal, the sum and difference components are identical because the $F_M$ component is zero. The modulation signal on line 57 is applied to a D-type flip flop 58 to produce a real component output signal on line 59 having a frequency ($F_M$) and an inverted output signal on line 61 having a frequency ($F_M$). Line 61 is connected back to the data input of the flip flop 58. The data input to flip flop 58 on line 57 serves as a clock signal input and the data outputs on lines 61 and 59 are phase shifted by 180° as will be explained in greater detail hereinafter. The real output on line 59 is applied to one input of exclusive OR circuit 62. The signal on line 57 is delayed as it passes through exclusive OR circuit 63 which merely serves as a delay gate to equalize the time delay through the D-type flip flop 58 and is only important for frequencies in excess of 50 megahertz. The delay gate device 63 need not be an exclusive OR circuit to accomplish the logic delay gate time function. The output of gate 63 on line 64 is applied as the second input to exclusive OR circuit 62 to produce an output on line 65 that is passed through the cutoff filter 66 which will be explained in greater detail hereinafter. The output of filter 66 on line 67 is applied to one of two mixers 68. The signal on line 59 at the base modulation frequency ($F_M$) is passed through a second cutoff filter 69 and via line 71 to the second mixer 72. It will be noted that the D-type flip flop 58 in conjunction with the operation of the exclusive OR circuit 62 perform the function of supplying digital phase shifted signals to the mixers 68 and 72. As will be explained in detail hereinafter these phase shifted signals are always in quadrature independent of the frequency of the signal on line 57 and are not subject to phase and amplitude distortion of the prior art image reject circuit.

The RF signal on line 73 is applied to a power divider 74 to provide two equal and inphase outputs on lines 75 and 76 which are applied to the mixers 68 and 72 respectively to produce output signals on lines 77 and 78 which are applied to the quadrature hybrid circuit 79. The desired side band frequencies are produced as a sum side band product on output line 81 and a difference side band product on line 82. The sum and difference subharmonics products on line 81 and 82 contain subharmonics of the modulated signal frequency ($F_M$) resulting from the square wave input applied to the mixer 68 and 72. If the subharmonic signals are applied directly to a phase-locked loop, they do not present any problem, however, if the signals on lines 81 and 82 are applied to other types of utilization devices it may be necessary to employ cutoff filters 66 and 69 in the inputs to the mixers 68 and 72 to reduce the magnitude of the subharmonics. The cutoff filters 66 and 69 may be designed as simple RC cutoff filters or may be designed in a more expensive implementation as programmable bandwidth filters or filters programmed by the modulation signal clock frequency. In the preferred embodiment use of the present invention circuit 60 with a phase-locked loop the delay gate 63 and the cutoff filters 66 and 69 become optional equipment not necessary for proper operation of the circuit.

Refer now to FIG. 7 showing a waveform diagram illustrating the principle of operation of the digital phase shift circuit employed with the novel image reject circuits of the present invention. The leading edge 83 of the input signal on line 57 insures operation of flip flop 58 which is an edge triggered D-type flip flop and the input signal is applied to the clock input. The leading edge 84 of the square wave output signal on line 59 is occurring at half the frequency of the clock signal on line 57 and has its leading edge synchronized with the leading edge 83. The logic switching time of flip flop 58 is so small that the delay between edges 83 and 84 is negligible for purposes of this application. The leading edge 86 of the second pulse on line 59 in FIG. 7 is shown being removed from the leading edge 84 by a clock cycle or 360°. The leading edge 85 of the signal appearing on output line 65 is synchronized with the trailing edge 87 of the clock signal on line 57, thus, is phase shifted 90° from the leading edge 84. The signal on line 71 is applied as an input to mixer 72 and is in sync and in phase with the signal on line 59. The signal on line 67 applied as an input to mixer 68 is 90° phase shifted from the signal on line 59. The digital phase shifter employed in the present invention image reject circuit maintains its synchronization and exact phase shift at the inputs to the mixer 68 and 72 so that no phase distortion occurs at the output.

Refer now to FIG. 8 showing a block diagram of a modification of the preferred embodiment invention shown in FIG. 6 which uses simpler components and produces a single side band signal output. The input lines and the elements which comprise the digital phase shifter are numbered the same as the elements in FIG. 6 and operate in the same mode of operation and need not be discussed in detail. The radio frequency input line 73 is applied to an analog 90° phase shifter 88 to produce a phase shifted output on line 89 and an inphase output on line 91 which are applied to the mixers 68 and 72 respectively. The aforementioned sum and difference products on lines 77 and 78 are applied to a power combiner 92 to produce a single side band difference component on line 93. If the sum side band component is desired as an output on 93 it is only necessary to switch the connections of inputs 59 and 65 to their mixer 68 and 72 respectively. Further, it will be understood that the optional cutoff filters 66 and 69 shown in FIG. 6 and the equalizing time delay gate 63 may also be employed in the modified circuit shown in FIG. 8 if desired.

Refer now to FIG. 9 showing a frequency spectrum waveform of the power output signal occurring on line 81 of FIG. 6 as the sum side band component signal (also present on line 93 in FIG. 8). The waveform diagram of FIG. 9 was obtained by connecting a spectrum analyzer to output line 81 of the image reject circuit of the type shown in FIG. 6 employing a cutoff filter. The $F_M$ input signal on line 57 was at 152 kilohertz and the RF input signal on line 73 was at 94.4 megahertz. The frequency divisions shown on the waveform plot are 500 kilohertz per division and the relative power output was plotted in 10 decibel increments per division. The peak of the upper image shown at point 94 is centered between the peaks of the third harmonic shown at points 95 and 96. The rejected image peak is shown at point 97 and the symmetrical fifth harmonic peaks are shown at points 98 and 99. The aforementioned peaks 95, 96, 98 and 99 are not the actual harmonics but are peaks caused by the third and fifth harmonic of the frequency $F_M$ It will be noted that employing the optional cutoff frequency filters that the image rejection exceeds 20 db which is typical of the top of the range prior art devices. Thus, the present invention may be employed in prior art applications as well as in frequency synthesis applications. The spectral lines or humps which occur between the aforementioned identified odd harmonic output points are caused by higher order mixing product in the mixers 68 and 72 and for all practical purposes have no effect on the operation of the circuit. The present embodiment invention circuit may be employed with the cutoff filters inserted in the circuit as explained with reference to FIG. 6 or may be removed for operation in conjunction with a phase-locked loop which includes a loop filter that is usually capable of removing all the undesired harmonics or subharmonics.

Having explained a preferred embodiment of the present invention employing a pair of mixers and a single quadrature hybrid circuit and a digital phase shifting circuit at the input of the mixers, it will be appreciated that the present embodiment image reject circuit has advantages over the prior art circuits in that the frequency of the modulation signal can vary over an extremely broad range from DC up to 100 Mhz only limited by the switching rate of the components employed and that the distortion usually associated with analog input phase shifters and mixers is completely eliminated at the output of the present invention circuit.

What is claimed is:

1. An image reject apparatus for producing a broad multiple octave range of signal synthesis frequencies, comprising:
   digital synthesis input signal means for receiving $2F_M$ frequency signals at twice the desired output sideband frequency,
   digital phase shifter means coupled to said $2F_M$ digital input signal means for producing a $F_M$ digital inphase output signal and a $F_M$ digital 90° phase shifted output signal in exact digital quadrature,
   RF input signal means for receiving $F_{RF}$ frequency signals,
   power divider means coupled to said $F_{RF}$ input signal means for producing a first and a second power output signal,
   a first mixer coupled to said first power output signal and to said $F_M$ digital 90° phase shifted output signal,
   a second mixer coupled to said second power output signal and to said $F_M$ digital inphase output signal, and
   means for combining the outputs of said mixers to produce a sum or difference product output signal expressed as $(F_{RF}+F_M)$ and $(F_{RF}-F_M)$ wherein the modulation signal component $F_M$ is one-half the input modulation frequency $2F_M$.

2. An image reject apparatus for a broad range of signal synthesis frequencies, comprising:
   digital synthesis input signal means for receiving $2F_M$ frequency signals,
   digital phase shifter means coupled to said digital input signal means for producing a digital inphase output signal and a digital 90° phase shifted output signal in exact quadrature relation over said broad range of frequencies,
   RF input signal means for receiving $F_{RF}$ frequency signals,
   power divider means coupled to said $F_{RF}$ input signal means for producing a first and a second power output signal,
   a first mixer coupled to said first power output signal and to said digital 90° phase shifted output signal,
   a second mixer coupled to said second power output signal and to said digital inphase output signal, and
   means for combining the outputs of said mixers to produce a sum or difference product output signal expressed as $(F_{RF}+F_M)$ and $(F_{RF}-F_M)$.

3. An image reject apparatus as set forth in claim 2 wherein said power divider means comprises an analog 90° phase shifter.

4. An image reject apparatus as set forth in claim 3 wherein said 90° phase shifter comprises a quadrature hybrid circuit.

5. An image reject apparatus as set forth in claim 2 wherein said means for combining the outputs of said mixers comprises a quadrature hybrid circuit.

6. An image reject apparatus as set forth in claim 2 wherein said digital phase shifter comprises a D-type flip flop and an exclusive OR gate coupled to the output of said D-type flip flop and to the digital synthesized input signal means.

7. An image reject apparatus as set forth in claim 6 wherein said digital synthesized input signal means are coupled to the clock input of said D-type flip flop.

8. An image reject apparatus as set forth in claim 6 which further includes an equalizing delay gate in series with the digital synthesized input signal to said exclusive OR circuit.

9. An image reject apparatus as set forth in claim 2 wherein said means for combining the outputs of said mixers comprises a quadrature hybrid circuit for producing both a sum and difference output product signal.

10. An image reject apparatus as set forth in claim 2 which further includes a pair of cutoff filters in series in said digital inphase and in said digital 90° phase shifted output from said digital phase shifter.

* * * * *